US006078094A

United States Patent [19]
Poplevine et al.

[11] Patent Number: 6,078,094
[45] Date of Patent: Jun. 20, 2000

[54] STARTER CURRENT SOURCE DEVICE WITH AUTOMATIC SHUT-DOWN CAPABILITY AND METHOD FOR ITS MANUFACTURE

[75] Inventors: Pavel Poplevine, Foster City; Alexander Kalnitsky, San Francisco; Albert Bergemont, Palo Alto, all of Calif.

[73] Assignee: National Semiconductor Corporation, Santa Clara, Calif.

[21] Appl. No.: 09/196,458

[22] Filed: Nov. 19, 1998

[51] Int. Cl.[7] .............................. H01L 29/80; H01L 29/00
[52] U.S. Cl. ........................... 257/536; 257/543; 257/268
[58] Field of Search ..................................... 257/271, 375, 257/376, 536–543, 379–381, 268, 269

[56] References Cited

PUBLICATIONS

Phillip E. Allen, et al., *Current and Voltage References*, in CMOS Analog Circuit Design, Oxford University Press, 1987, pp. 241–251.

Paul R. Gray, et al., Transistor Current Sources and Active Leads, in Analysis and Design of Analog Integrated Circuits, 3rd Edition, John Wiley & Sons, Inc., 1993, pp. 326–331.

*Primary Examiner*—Tom Thomas
*Assistant Examiner*—Ori Nadav
*Attorney, Agent, or Firm*—Limbach & Limbach L.L.P.

[57] ABSTRACT

An analog circuit starter current source device with automatic shut-down capability. The device includes a semiconductor substrate (typically p-type) with a deep well region (typically n-type) below its surface, a first surface well region (typically n-type) on the surface of the substrate that circumscribes the deep well region, and a narrow channel region (typically p-type) separating the deep well region from the first surface well region. The device also includes a first contact region for connecting the first surface well region to the analog circuit, and a second contact region for connecting a substrate region above the deep well to the analog circuit. The configuration provides a variable-width vertical resistor current path capable of starting an analog circuit and then being automatically shut-down by application of a potential to the first contact region sufficient to produce a depletion region that pinches-off the narrow channel region. A process for forming the starter current source device is also provided. The process includes first providing a semiconductor substrate (e.g. p-type), then forming a deep well region (e.g. n-type) below its surface. This is followed by the formation of a first surface well region (e.g. n-type) on the surface of the substrate such that the first surface well region circumscribes the deep well region, thereby producing a narrow channel (e.g. p-type) therebetween. Finally, a first contact region is formed on the surface of the first surface well region, while a second contact region is formed on the surface of semiconductor substrate above the deep well region.

9 Claims, 9 Drawing Sheets

♦ EXAMPLE
■ REFERENCE

STARTER CURRENT SOURCE DEVICE WITH AUTOMATIC SHUT-DOWN CAPABILITY AND METHOD FOR ITS MANUFACTURE

BACKGROUND OF THE INVENTION

1. Field of the Invention

The present invention relates to semiconductor devices and, in particular, to starter current source devices for use with analog circuits and processes for their manufacture.

2. Description of the Related Art

A variety of Metal-Oxide-Semiconductor (MOS) and bipolar analog device circuits, including current mirrors, self-biased circuits, voltage references and current references, require a start-up device (e.g. a starter current source device) to shift such circuits from an undesired equilibrium state at the commencement of their operation. See, for example, Phillip E. Allen and Douglas R. Holberg, Current and Voltage References, in *CMOS Analog Circuit Design*, 240–251 (Oxford University Press, 1987) and Paul R. Gray and Robert G. Meyer, Transistor Current Sources and Active Leads, in *Analysis and Design of Analog Integrated Circuits*, 326–331 (John Wiley & Sons, Inc., 1993), both of which are hereby incorporated by reference.

Figure 1:
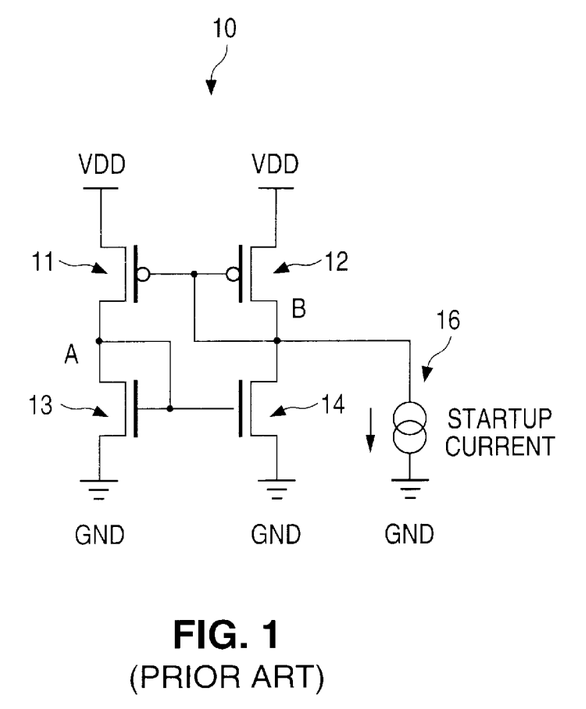
FIG. 1 is an electrical schematic depicting a conventional current mirror and an associated starter current source device.

An example of an analog device circuit that requires a start-up device is the current mirror 10 shown schematically in FIG. 1. Current mirror 10 includes interconnected MOS transistors 11, 12, 13 and 14 and can have, on commencement of its operation, its node A at ground potential and its node B at $V_{dd}$, therefore being at an equilibrium state. In this state, both the left-hand branch (i.e. MOS transistors 11 and 13) and right-hand branch (i.e. MOS transistors 12 and 14) of the current mirror 10 are shut-down. This undesirable equilibrium state can be prevented by providing a separate starter current source device 16 connected to node B of the current mirror, as illustrated in FIG. 1.

Figure 2:
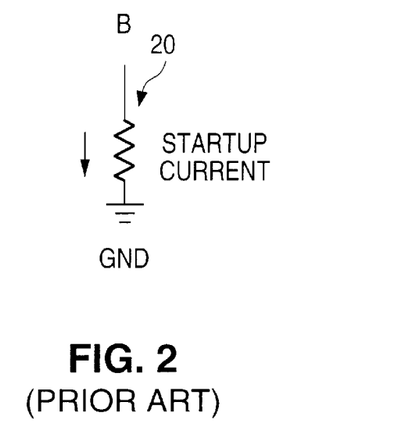
FIG. 2 is an electrical schematic depicting a conventional resistor-based starter current source device.
Figure 3:
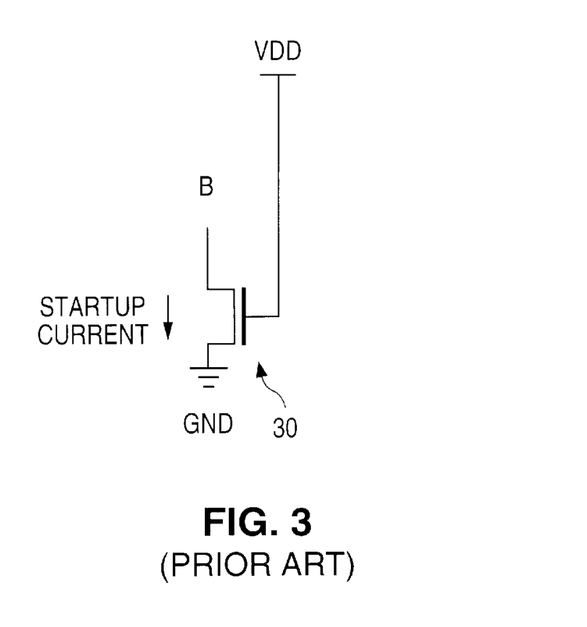
FIG. 3 is an electrical schematic depicting a conventional MOS transistor-based starter current source device.
Figure 4:
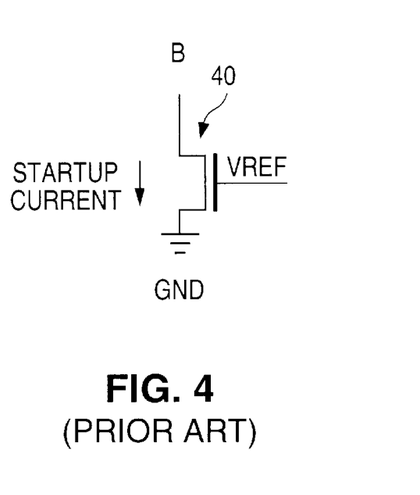
FIG. 4 is an electrical schematic depicting another conventional MOS transistor-based starter current source device.

Conventional starter current source devices for use with current mirrors can take the form of: (i) a resistor 20 connected between node B of the current mirror and ground (GND), as shown in FIG. 2; (ii) an MOS transistor 30 with its gate connected to $V_{dd}$, while its source is connected to node B of the current mirror and its drain is connected to ground, as shown in FIG. 3; and (iii) an MOS transistor 40 with its gate connected to a reference voltage ($V_{ref}$), while its source is connected to node B of the current mirror and its drain is connected to ground, as shown in FIG. 4. These starter current source devices are used to supply a sufficient amount of current to shift the potential at node B of the current mirror 10 closer to ground potential, thereby allowing current to flow through the right-hand branch MOS transistor 12 connected between $V_{dd}$ and node B. An identical amount of current, as is flowing through the right-hand branch, then also flows in the left-hand branch of the current mirror 10, thereby raising the potential of node A towards $V_{dd}$ and ensuring the proper commencement of operation of current mirror 10.

A drawback of conventional starter current source devices is that current continues to flow through the devices and power consumption persists, even after the associated analog device circuit has commenced its desired operation.

Still needed in the art is a starter current source device that is capable of being shut-down automatically upon commencement of operation of an associated analog circuit. Also needed is a process for its manufacture that is simple and compatible with standard semiconductor device processing.

SUMMARY OF THE INVENTION

The present invention provides a starter current source device with automatic shut-down capability for use with MOS or bipolar analog device circuits. The starter current source device according to the present invention includes a semiconductor substrate of a first conductivity type (typically p-type) with a deep well region of a second conductivity type (typically n-type) disposed below the surface of the semiconductor substrate. The starter current source device in accordance with the present invention also includes a first surface well region of the second conductivity type disposed immediately underneath the surface of the semiconductor substrate and completely circumscribing the deep well region, and a narrow channel region of the first conductivity type (also disposed in the semiconductor substrate) that separates the deep well region from the first surface well region. Also included in the starter current source device according to the present invention is a first contact region for electrically connecting the first surface well region to the analog device circuit and a second contact region for electrically connecting the semiconductor substrate region directly above the deep well region (i.e. an active area in the semiconductor substrate) to the analog device circuit.

The structural configuration of the starter current source device according to the present invention provides a variable-width vertical resistor current path from the second contact region, through the narrow channel region, to the semiconductor substrate and ground. The current can be used to start an analog device circuit. This vertical resistor current path is "variable-width" since the width of the narrow channel region can be "pinched-off" (i.e. shut-down either completely or partially) by applying a potential to the first contact region sufficient to produce a depletion region extending from the first surface well region into the narrow channel region. The starter current source device can be completely shut-down by extending the depletion region across the entire narrow channel region to the deep well region. This unique configuration of the starter current source device according to the present invention, therefore, makes it possible to first start an analog device and then to shut-down automatically, in response to an increased potential supplied from the analog device circuit to the first contact regions upon commencement of operation of the analog device.

Also provided is a process for forming a starter current source device that includes first providing a semiconductor substrate of a first conductivity type (typically p-type), followed by forming a deep well region of a second conductivity type embedded below the surface of the semiconductor substrate. An electrical isolation region is then formed on the surface of the semiconductor substrate above the deep well region. A first surface well region of the second conductivity type is subsequently formed immediately underneath the surface of the semiconductor substrate. The first surface well region completely circumscribes (i.e. encircles) the deep well region, producing a narrow channel of the first conductivity type therebetween. Next, a first contact region is formed on the surface of the first surface well region, while a second contact region is formed on the surface of the semiconductor substrate above the deep well region. The deep well region, first surface well region, and first and second contact regions are formed, for example, by photomasking and ion implantation techniques.

BRIEF DESCRIPTION OF THE DRAWINGS

A better understanding of the features and advantages of the present invention will be obtained by reference to the following detailed description that sets forth illustrative embodiments in which the principles of the invention are utilized, and the accompanying drawings of which:

FIGS. 8A–14 are cross-sectional and layout views illustrating stages of a process in accordance with the present invention, wherein FIGS. 8B, 9B, 10B and 11B are cross-sectional views taken along lines 8B—8B, 9B—9B, 10B—10B and 11B—11B of FIGS. 8A, 9A, 10A and 11A respectively.

DETAILED DESCRIPTION OF THE INVENTION

Figure 5:
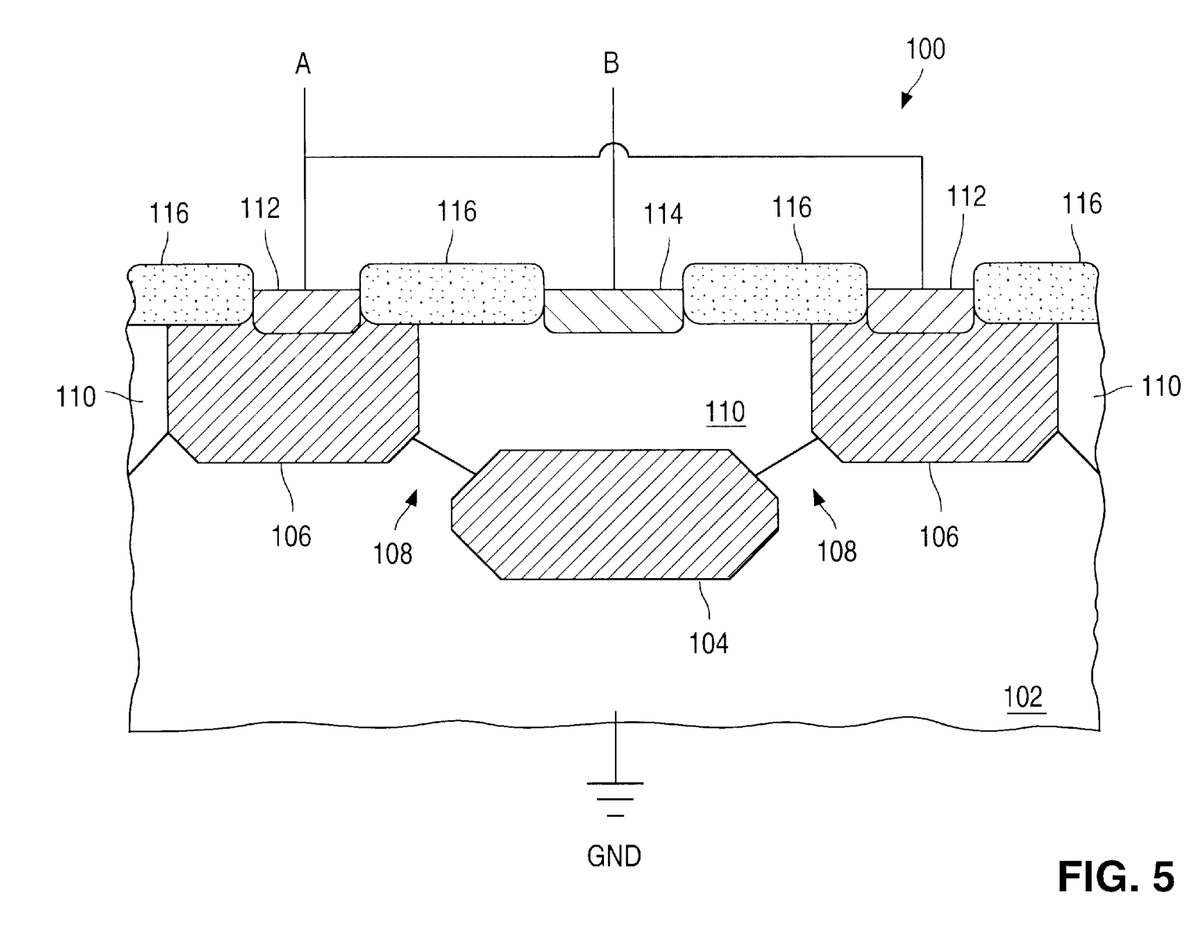
FIG. 5 is a combined cross-sectional and electrical schematic view of a starter current source device in accordance with the present invention.

FIG. 5 depicts, in combined cross-sectional and electrical schematic format, a starter current source device 100 in accordance with the present invention. Starter current source device 100 includes a semiconductor substrate 102 of a first conductivity type, typically p-type. When starter current source device 100 is in operation, semiconductor substrate 102 is electrically connected to ground (GND), as illustrated schematically in FIG. 5. Starter current source device 100 also includes a deep well region 104 and a first surface well region 106, both of a second conductivity type (typically n-type). The deep well region 104 is embedded below the surface of semiconductor substrate 102, while the first surface well region 106 is disposed immediately underneath that surface. The first surface well region 106 completely circumscribes (i.e. encircles) the deep well region 104 as shown in FIG. 5, as well as in FIGS. 11A and 11B. The first surface well region 106 can partially overlap (as will be described further below with reference to FIG. 15), or be offset (e.g. 0.5 microns to 7.0 microns) from, the deep well region 104.

The distance between the bottom of the first surface well region 106 and the surface of the semiconductor substrate 102, namely the depth of the first surface well region 106, is typically in the range of 0.7 microns (for an 0.1 micron process technology) to about 4.0 microns (for a 5 micron process technology). The distance 104 from the surface of the semiconductor substrate 102 to the top of the deep well region is predetermined based on the depth of the first surface well region 106. In one embodiment, the top of the deep well region 104 is approximately level with, or slightly underneath, the bottom of the first surface well region 106. A typical width for the deep well region is 1 micron, while that of the first surface well region is 0.4 microns.

The deep well region 104 is separated from first surface well region 106 by narrow channel region 108, which is of the first conductivity type. At its narrowest point, narrow channel region 108 is typically from 0.2 microns to greater than 5.0 microns in width depending on the voltage that will be used to drive an associated analog device circuit. For a five (5) volt device technology, the narrow channel region 108 will typically be up to five (5) microns in width, while for a 3.3 volt technology, two (2) microns.

Starter current source device 100 optionally includes second surface well region 110 of the first conductivity type immediately underneath the surface of the semiconductor substrate 102 above deep well region 104. Since the second surface well region 110 is of the same conductivity type as the semiconductor substrate 102, the second surface well region 110 need not be present in starter current source devices according to the present invention. If the second surface well region 110 is not present, the region of the semiconductor substrate 102 above the deep well region is simply referred to as an active area. It is, however, standard practice to form such second surface well regions in conventional CMOS processing. The inclusion of a second surface well region 110, therefore, provides for a starter current source device that can be manufactured with a minimum number of deviations from standard semiconductor processing techniques.

Figure 6:
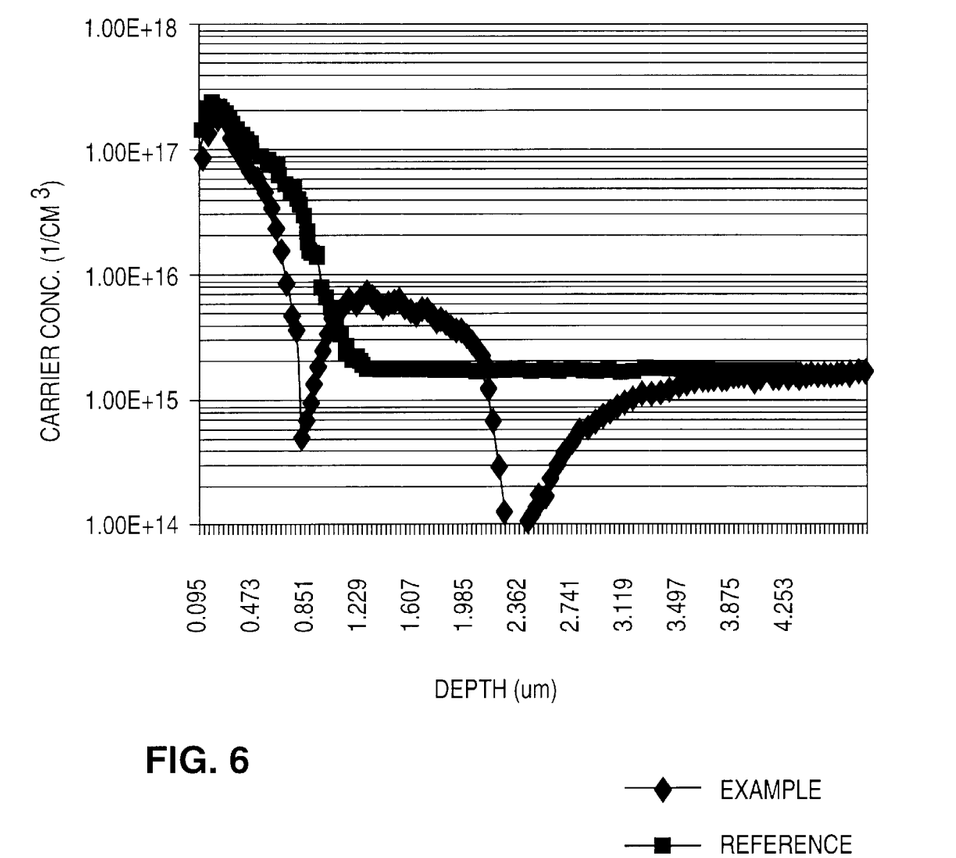
FIG. 6 is a graph of carrier concentration versus depth for a p-type second surface well region and n-type deep well region of a starter current source device in accordance with the present invention compared to a reference p-type surface well region in the absence of an n-type deep well region.

FIG. 6 illustrates the carrier concentration depth profiles, obtained from Spreading Resistance Profile (SRP) data, of (i) a reference surface well region of p-type conductivity in a p-type semiconductor substrate without any n-type deep well regions, and (ii) a portion of an example starter current source device according to the present invention with a p-type second surface well region disposed above an n-type deep well region in a p-type semiconductor substrate. In the example of FIG. 6, the top and bottom of the deep well region are about 1.2 microns and 2.4 microns, respectively, below the surface of the semiconductor substrate. The peak carrier concentration in the deep well region of FIG. 6 is in the range of 1E+15 to 1E+16 ions per $cm^3$.

Referring again to FIG. 5, starter current source device 100 also includes first contact regions 112 disposed on the surface of the first surface well region 106, and second contact region 114 disposed on the surface of the semiconductor substrate above the deep well region 104. The first contact regions are of the same conductivity type as the first surface well region, while the second contact region is of the same conductivity type as the semiconductor substrate itself. Typically, the first contact regions 112 and the second contact region 114 are formed by increasing the doping level of a portion of the first surface well regions 106 and second surface well regions 110, respectively. For example, in the circumstance where the semiconductor substrate and second surface well regions are p-type, and the deep well region and first surface well regions are, therefore, n-type, the first contact region is simply a more heavily doped n-type region within the first surface well region, while the second contact region is merely a more heavily doped p-type region within the second surface well region.

First contact regions 112 and second contact region 114 serve as electrical connection nodes for connecting starter current source device 100 to nodes A and B (shown schematically in FIG. 5), respectively, of an analog device circuit (not shown), such as the current mirror of FIG. 1. The depth of the first contact regions 112 and the second contact region 114, which is process technology dependent, is typically 0.05 micron to 1 micron. The width of the first contact regions 112 and the second contact region 114 is typically greater than 0.2 micron.

Starter current source device 100 also includes electrical isolation regions 116 typically formed of silicon oxide ($SiO_2$) that separate and electrically isolate the first contact regions 112 from the second contact region 114. Electrical isolation regions 116 also isolate starter current source device 100 from nearby semiconductor devices (not shown).

The starter current source device 100 of FIG. 5 is essentially a variable-width vertical resistor with a variable-width vertical resistor current path, which is composed of the second contact region 114, the second surface well region 110 (or the active area), the narrow channel region 108 and the semiconductor substrate 102, all of which are typically p-type. The narrow channel region 108 of this variable-width vertical resistor is disposed between the first surface well region 106 and the deep well region 104, both of which are typically n-type. When zero potential is applied to the first contact regions 112, the resistance of the variable-width vertical resistor is typically in the range of 10 ohms to a few kilo-ohms. However, upon application of a potential sufficient to produce a depletion region extending from the first surface well region 106 toward the deep well region 104, the resistance of the variable-width vertical resistor can be increased to more than 100 kilo-ohms, or even to an essentially open circuit. When a potential is applied to the first contact regions 112, this depletion region "pinches off" the width of the narrow channel region 108 by creating a potential barrier within the variable-width vertical resistor current path. If the depletion region extends across the narrow channel region until it meets the deep well region, the variable-width vertical resistor current path is completely blocked (i.e. shut-down) and the variable-width vertical resistor consequently becomes an essentially open circuit. Since the width of the narrow channel region can be varied by adjusting the extent of the depletion region, the narrow channel region is also referred to as a variable-width narrow channel region.

Figure 7:
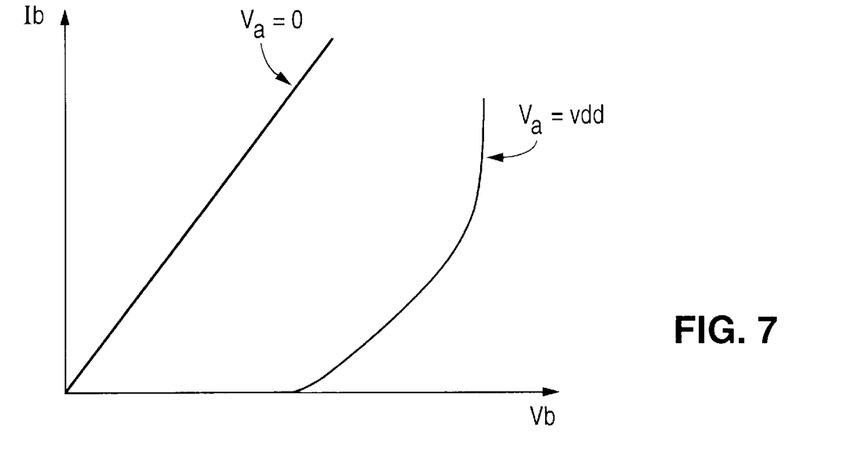
FIG. 7 is a current versus voltage (I-V) graph illustrating the desired idealized electrical behavior of starter current source devices in accordance with the present invention.

Starter current source devices according to the present invention can function as a startup device having automatic shut-down capability when used in association with analog device circuits. The desired I-V characteristics for such a startup device are illustrated in FIG. 7. When the first contact regions (also referred to as the controlling node or node A) of the starter current source device are at zero potential (i.e. $V_a$=0 volts), the second contact region (also referred to as the controlled node or node B) is connected to ground through a relatively low resistance variable-width vertical resistor current path. When $V_a$ is zero, current ($I_b$) flowing from node B to ground will increase as the potential on node B ($V_b$) is increased. However, once a potential is applied to the first contact regions and the potential on node A is increased to $V_{dd}$ (i.e. significantly above 0 volts), the resistance between node B and ground is greatly increased due to formation of a depletion region within the variable-width narrow channel region. Since the formation of the depletion region around the first surface well region extending to the deep well region "pinches off" the variable-width narrow channel region, current no longer flows through the starter current source device at low values of $V_b$. This pinching-off of the variable-width narrow channel region creates a relatively high resistance path between node B and ground.

When a sufficient amount of potential is applied to the first contact region so that the depletion region extends all the way to the deep well region (i.e. complete pinch off of the variable-width narrow channel region), the starter current source device automatically shuts off. If the semiconductor substrate 102 is p-type and doped on the order of 2E+15 per $cm^3$, an n-type deep well region and n-type first surface well region can be formed with a five (5) micron wide narrow channel region that will require an approximately 5 to 6 volt potential at node A to shut-down the starter current source device. Lower voltage shut-down operation can be achieved by reducing the width of the narrow channel region that separates the deep well region from the first surface well region.

The automatic shut-down capability of the starter current source device according to the present invention is now illustrated through description of its use in association with the current mirror of FIG. 1. To employ the starter current source device according to the present invention, as depicted in FIG. 5, with the current mirror, the first contact regions 112 are electrically connected to node A of the current mirror 10, while the second contact region 114 is connected to node B. If upon commencement of operation of the current mirror 10, the potential on node A of the current mirror is close to 0 volts, then the potential on node A of the starter current source device (i.e. first contact regions 112) is also close to 0 volts, and a continuous current path exists from node B, through the starter current source device, to ground via the narrow channel region 108. Once the potential on node B of the current mirror is reduced by current flowing through the starter current source device, the operating current and voltage of the current mirror is transferred through both the left-hand and right-hand branches of the current mirror, thereby raising the potential at node A towards $V_{dd}$. This potential, applied to the first contact regions 112 of the starter current source device 100, will cause the narrow channel region 108 to pinch-off due to a merging of the depletion region around the first surface well region with the deep well region. This narrow channel region pinch-off corresponds to a high resistance in the variable-width vertical resistor current path between node B of the starter current source device 100 and its semiconductor substrate 102. This high resistance in the variable-width vertical resistor current path impedes current flow through the starter current source device to ground, thereby automatically shutting-down the device. The shut-down is "automatic" in the sense that the current flow and power consumption of the starter current source device 100 ceases without additional intervention once the potential at node A of the current mirror reaches $V_{dd}$. The automatic shut-down capability minimizes the power consumption of the starter current source devices in accordance with the present invention.

Starter current source devices according to the present invention can be used in association with any MOS or bipolar analog device circuit that requires a start-up device, for example a current mirror circuit, self-biased circuit, voltage reference circuit, or current reference circuit. There must, however, be a node in the analog device circuit which can be electrically connected to the first contact regions of the starter current source device (i.e. the controlling node of the starter current source device or node A). Such a node must be at a low potential when the analog device circuit is in an undesired equilibrium state during commencement of its operation, while being at a higher potential once the analog device circuit has commenced proper operation.

Figure 8A:
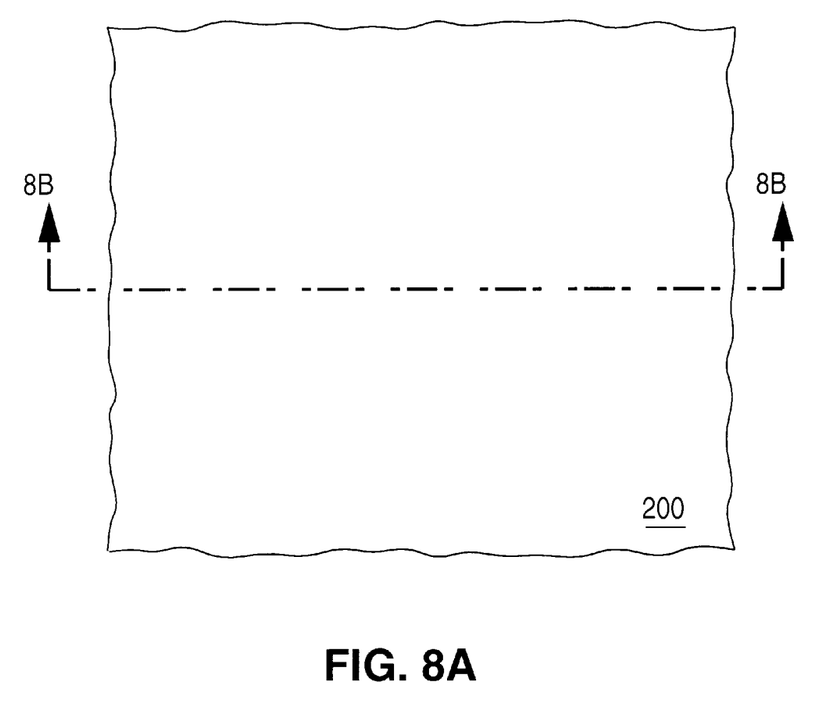
Figure 8B:
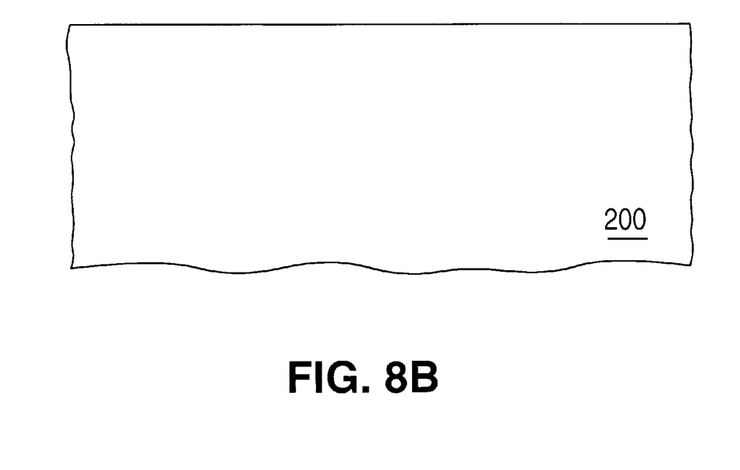

Also provided is a process for forming a starter current source device for use with analog device circuits that is simple and compatible with standard CMOS and bipolar semiconductor manufacturing techniques. FIGS. 8A–14 illustrate, using cross-sectional and layout views, stages of a process for the formation of a starter current source device according to the present invention. A semiconductor substrate 200 of a first conductivity type (typically p-type) is initially provided, as shown in FIGS. 8A and 8B. A deep well region 202 of a second conductivity type is then formed in semiconductor substrate 200. Deep well region 202 can be formed using conventional photomasking, dopant ion implantation and thermal diffusion techniques known to those of skill in the art. A typical deep well formation steps can include first forming a patterned deep well photomask on the surface of semiconductor substrate 200, followed by ion implantation, removal of the photomask, and thermal diffusion and activation of the implanted ions.

Figure 9A:
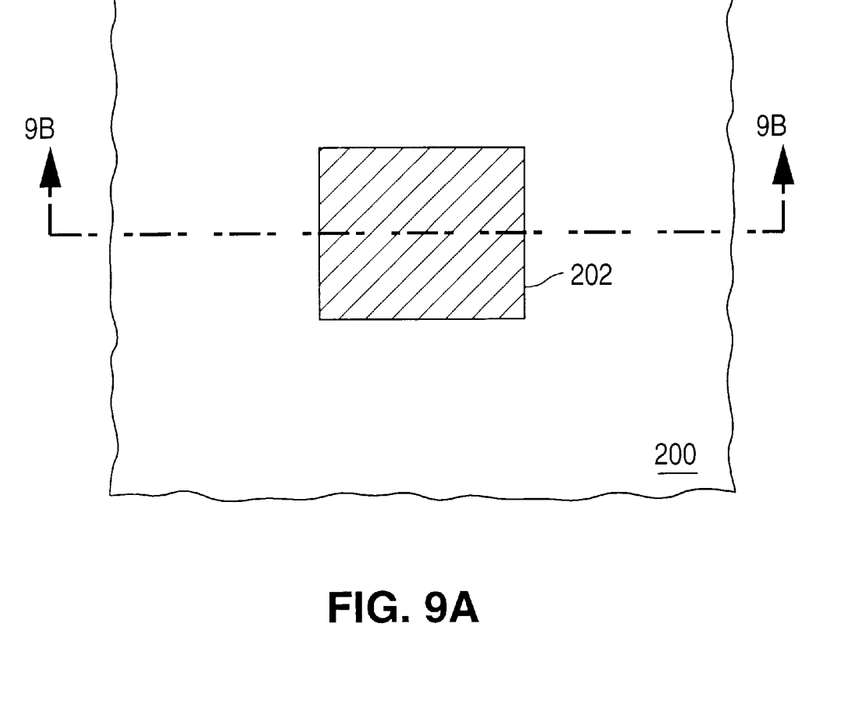
Figure 9B:
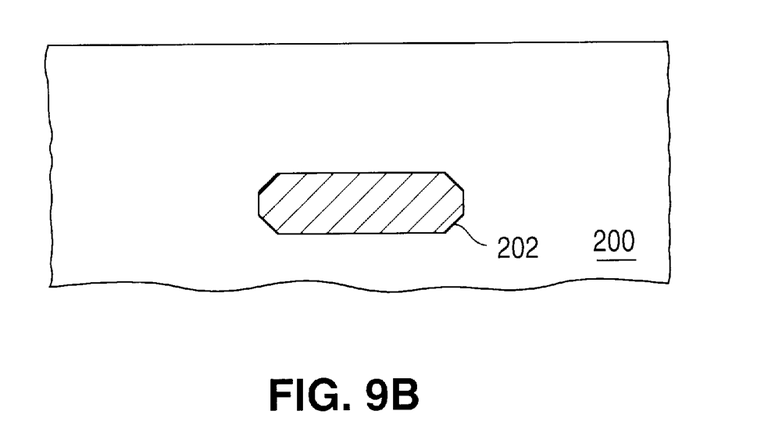

Typical conditions used for the formation of an n-type deep well region are a phosphorus ion implant through a patterned photomask with the phosphorous ($P_{31}+$) ion dose being in the range of 1E+12 to 1E+14 ions/cm$^2$ and the implant energy being in the range of 100 KeV to 1000 KeV. After removal of the patterned photomask, the implanted phosphorus ions are thermally diffused into the semiconductor substrate 202 at a temperature of 1000° C. to 1175° C. for several hours in a 5%–10% oxygen ($O_2$) ambient. The resultant structure, following removal of any silicon oxide ($SiO_2$) layer grown on the surface of the semiconductor substrate during the thermal diffusion process, is illustrated in FIGS. 9A and 9B. When forming an n-type deep well region, any n-type dopant can be used, including, for example, phosphorus, arsenic or antimony. If arsenic or antimony are employed, thermal diffusion at a higher temperature may be required since these dopants diffuse at a slower rate than phosphorus at any given temperature. In addition, since phosphorus ion is lighter than arsenic or antimony, phosphorus ion can be more easily implanted to the required depth. The 5–15% $O_2$ ambient is used to accelerate the diffusion.

Figure 10A:
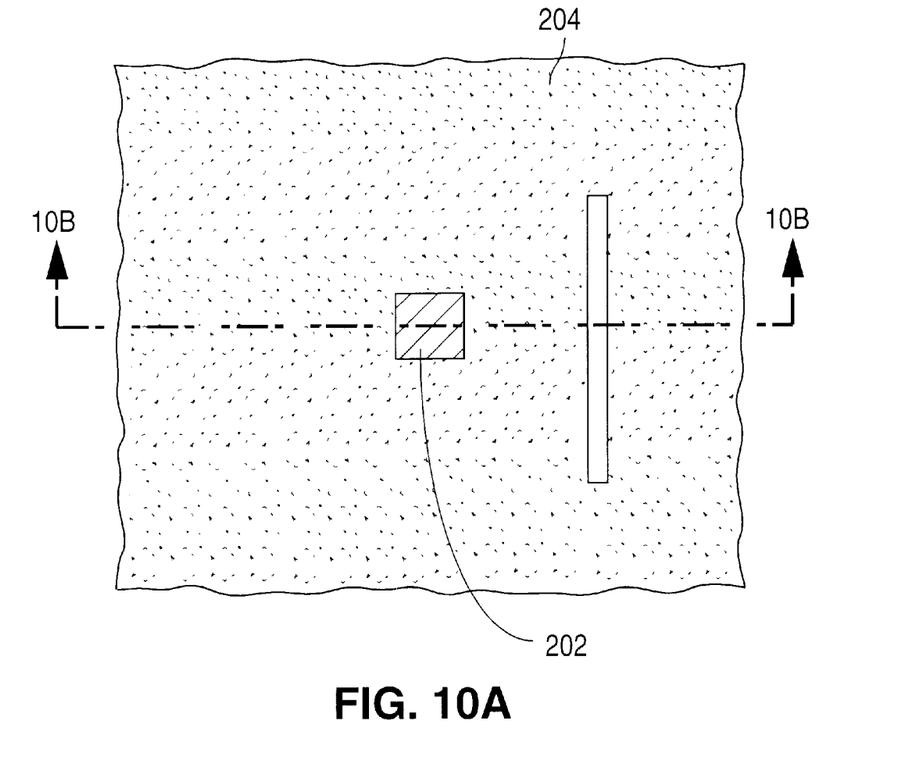
Figure 10B:
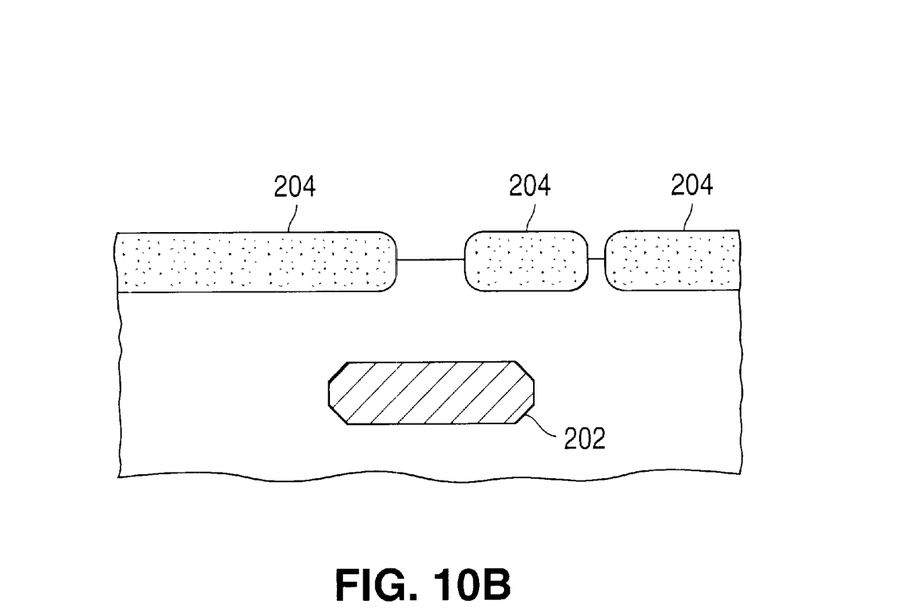

Next, electrical isolation region 204 is formed, as illustrated in FIGS. 10A and 10B, using conventional processes such as Shallow Trench Isolation (STI) or LOCal Oxidation of Silicon (LOCOS) that are well known in the art. The dimensions of the electrical isolation regions are dependent on the process technology used to form the analog device circuit with which the starter current source device will be used. The thickness of a typical electrical isolation region formed by LOCOS is, however, in the range of 2000 angstroms to 5000 angstroms, while that formed by STI is in the range of 2000 angstroms to 4000 angstroms.

Figure 11A:
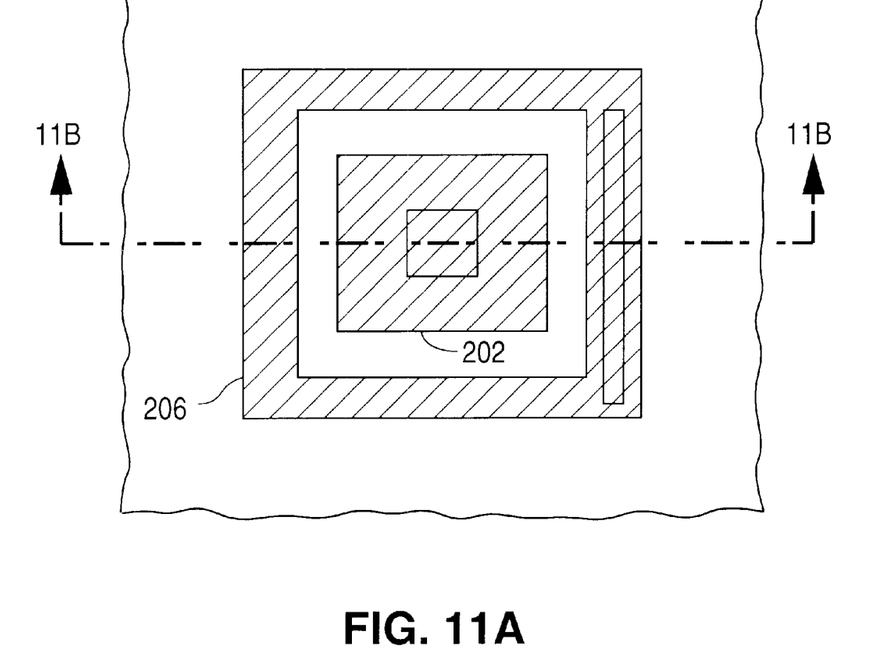
Figure 11B:
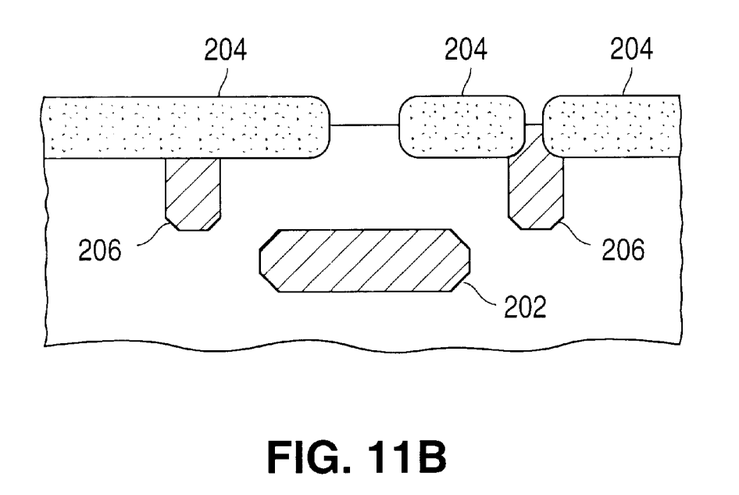
Figure 12:
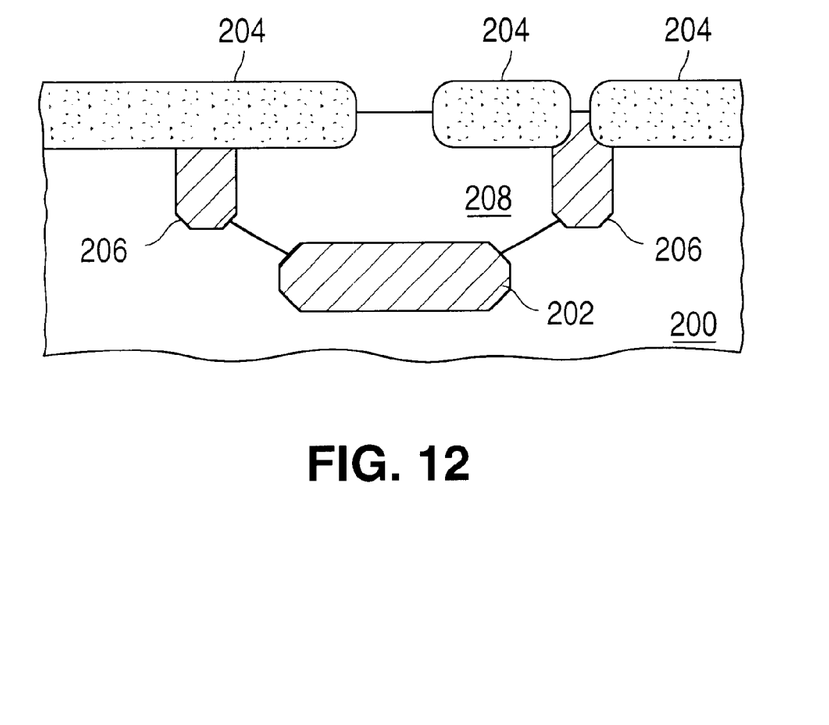

First surface well region 206 of the second conductivity type is then formed on the surface of semiconductor substrate 200 such that first surface well region 206 circumscribes (i.e. encircles) the deep well region 202. The resulting structure is illustrated in FIGS. 11A and 11B (with the electrical isolation region 204 eliminated from the layout view of FIG. 11A for clarity). The distance between the inner contour of the first surface well region and the outer boundary of the deep well region (i.e. the narrow channel width) determines the "pinch-off" voltage necessary to automatically shut-down the starter current source device in accordance with the present invention. First surface well region 206 can be formed using conventional photomasking and dopant ion implantation techniques known to those of skill in the art. A typical first surface well formation steps can include first forming a patterned first surface well photomask on the surface of semiconductor substrate 200, followed by ion implantation and removal of the photomask.

Typical conditions for the formation of an n-type first surface well region are a phosphorus ion implant through a patterned photomask, with the phosphorous ($P_{31}+$) ion dose being in the range of 1E+11 to 1E+12 ions/cm$^2$ and the implant energy being in the range of 100 KeV to 200 KeV. Thermal diffusion steps are infrequently used with surface well region ion implantation techniques, but when employed the typical temperature of such a thermal diffusion is in the range of 900° C. to 1150° C.

Next, second surface well region 208 of the first conductivity type is optionally formed in the semiconductor substrate above the deep well region 202, using standard photomasking and dopant ion implantation techniques. For a p-type second surface well region formation, a boron ($B_{11}+$) ion dose in the range of 1E+11 to 1E+13 ions per cm$^2$ at an energy of 60 KeV to 150 KeV energy would be typical. The resulting structure is depicted in cross-section in FIG. 12.

Next, first contact region 210 is formed on the surface of first surface well region 206 using, for example, standard photomasking and ion implantation techniques. A typical dose for a heavily phosphorus ion doped n-type first contact region is in the range of 1E+15 to 1E+16 ions per cm$^2$. The second contact region 212 is then formed on the surface of second surface well region 208 (or active area) using, for example, standard photomasking and ion implantation techniques. A typical dose for a heavily boron ion doped p-type first contact region is in the range of 1E+15 to 1E+16 ions per cm$^2$. The resultant cross sectional structure of the starter current source device according to the present invention is illustrated in FIG. 13.

Figure 13:
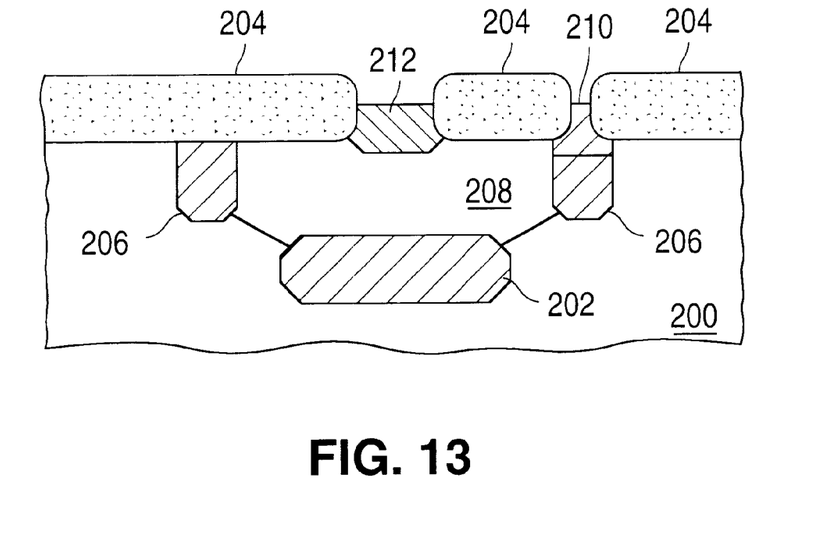
Figure 14:
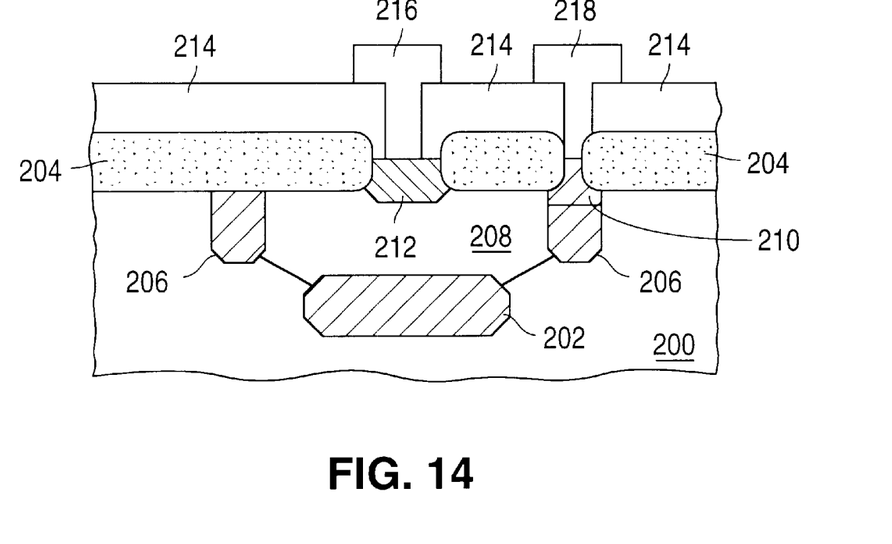

The starter current source device illustrated in FIG. 13 is functionally equivalent to that of FIG. 5. Electrical connections equivalent to the nodes A and B shown schematically in FIG. 5 can be formed on the structure of FIG. 13 by depositing a dielectric layer 214 (using standard dielectric layer deposition techniques), etching contacts through the dielectric layer (using standard photomasking and etching techniques), and then forming metal lines 216 and 218 (via metal deposition and patterning techniques known in the art). The resultant cross-sectional structure is illustrated in FIG. 14. Although a single first contact region 210 is shown in FIG. 13 versus two (2) first contact regions 112 in FIG. 5, one is sufficient since the first surface well region is continuous and unitary.

Figure 15:
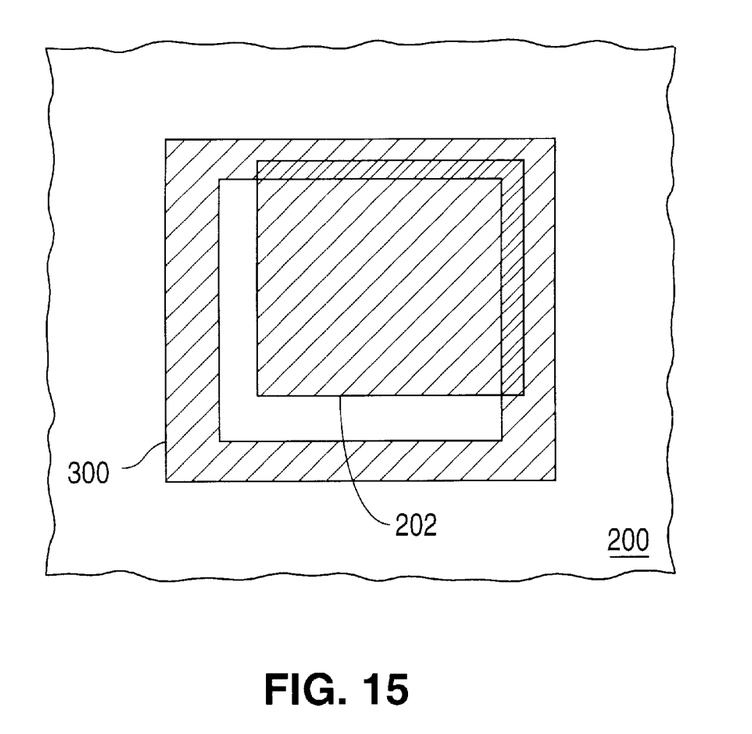
FIG. 15 is a layout view of one embodiment of a process in accordance with the present invention, in which a first surface well region is formed overlapping a deep well region.

In one embodiment of the process according to the present invention, a first surface well region 300 is formed such that it partially overlaps the deep well region 202, as shown in layout view in FIG. 15. By partially overlapping the deep well region with the first surface well region, a resultant starter current source device according to the present invention can include a variable-width vertical resistor current path with a narrow channel region of relatively small cross-sectional area. Such a path will have a relatively high resistance when the starter current source device is in a "pinched-off" (i.e. shut-down) state due to its small cross-sectional area.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A starter current source device with automatic shut-down capability for use with analog circuit devices, the starter current source device comprising:

a semiconductor substrate of a first conductivity type having an active area on its surface;

a deep well region of a second type disposed below the surface of the semiconductor substrate and below the active area of the semiconductor substrate;

a first surface well region of the second conductivity type disposed on the surface of the semiconductor substrate, the first surface well region circumscribing the deep well region and the active area of the semiconductor substrate;

a narrow channel region of the first conductivity type in the semiconductor substrate separating the deep well region from the first surface well region;

a first contact region of the second conductivity type for electrically connecting the first surface well region to the analog device circuit; and a second contact region of the first conductivity type for electrically connecting the active area of the semiconductor substrate to the analog device circuit.

2. The starter current source device of claim 1 further including at least one electrical isolation region separating and electrically isolating the first contact region from the second contact region.

3. The starter current source device of claim 1 wherein the first contact region and the second contact region are electrically connected to a current mirror.

4. The starter current source device of claim 1 wherein the first surface well region partially overlaps the deep well region.

5. The starter current source device of claim 1 wherein the active area includes a second surface well region of the first conductivity type.

6. The starter current source device of claim 5 wherein the narrow channel region separates the deep well region from the first surface well region by a distance of 0.2 microns to 5.0 microns.

7. The starter current source device of claim 6 wherein the first conductivity type is p-type and the second conductivity type is n-type and the deep well region and first surface well regions are doped with phosphorous ion to a peak carrier concentration in the range of 1E+15 to 1E+16 ions per $cm^3$.

8. A starter current source device with automatic shut-down capability for use with analog circuit devices, the starter current source device comprising:

a p-type semiconductor substrate;

an n-type deep well region disposed below the surface of the semiconductor substrate;

an n-type first surface well region disposed on the surface of the semiconductor substrate, the n-type first surface well region circumscribing the n-type deep well region;

a p-type second surface well region disposed above the n-type deep well region and circumscribed by the n-type first surface well region;

a p-type narrow channel region in the semiconductor substrate separating the n-type deep well region from the n-type first surface well region;

an n-type first contact region on the surface of the n-type first surface well region for electrically connecting the first surface well region to the analog device circuit; and a p-type second contact region on the surface of the p-type second surface well region for electrically connecting the active area of the semiconductor substrate to the analog device circuit.

9. The starter current source device of claim 8 wherein the narrow channel region separates the deep well region from the first surface well region by a distance of 0.2 microns to 5.0 microns.

* * * * *